US011257658B2

(12) United States Patent
Takahashi et al.

(10) Patent No.: US 11,257,658 B2
(45) Date of Patent: Feb. 22, 2022

(54) CHARGED PARTICLE BEAM APPARATUS

(71) Applicant: HITACHI HIGH-TECH CORPORATION, Tokyo (JP)

(72) Inventors: Noritsugu Takahashi, Tokyo (JP); Makoto Sakakibara, Tokyo (JP); Makoto Suzuki, Tokyo (JP); Minoru Yamazaki, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 314 days.

(21) Appl. No.: 16/572,873

(22) Filed: Sep. 17, 2019

(65) Prior Publication Data

US 2020/0105501 A1    Apr. 2, 2020

(30) Foreign Application Priority Data

Sep. 27, 2018    (JP) .............................. JP2018-181729

(51) Int. Cl.
*H01J 37/28*    (2006.01)
*H01J 37/12*    (2006.01)

(52) U.S. Cl.
CPC .............. *H01J 37/28* (2013.01); *H01J 37/12* (2013.01); *H01J 2237/21* (2013.01); *H01J 2237/31749* (2013.01)

(58) Field of Classification Search
CPC .. H01J 37/12; H01J 37/21; H01J 37/28; H01J 37/153; H01J 2237/216; H01J 2237/1532; H01J 2237/1534; H01J 2237/31749
See application file for complete search history.

(56) References Cited

U.S. PATENT DOCUMENTS

| 5,670,782 | A | 9/1997 | Sato | |
|---|---|---|---|---|
| 5,756,993 | A * | 5/1998 | Yoshinari | H01J 49/025 250/281 |
| 2008/0283744 | A1* | 11/2008 | Takada | H01J 37/153 250/307 |

FOREIGN PATENT DOCUMENTS

| JP | H08185823 A | 7/1996 |
|---|---|---|
| JP | 2008181786 A | 8/2008 |

OTHER PUBLICATIONS

Office Action dated Oct. 26, 2021 in Japanese Application No. 2018-181729.

* cited by examiner

*Primary Examiner* — David E Smith
*Assistant Examiner* — Hsien C Tsai
(74) *Attorney, Agent, or Firm* — Miles & Stockbridge, P.C.

(57) ABSTRACT

An object of the invention is to correct an aberration or a defocus of an electron beam for irradiation, and control an influence on a deflector by a fluctuation in an electric field of an electrostatic lens. The invention provides a charged particle beam apparatus including a deflector that deflects a charged particle beam with which a specimen is irradiated, an objective lens that focuses the charged particle beam on the specimen, an electrostatic lens that includes a part of the objective lens and to which a voltage for correcting the aberration or the defocus of the charged particle beam is applied, and an constant electric field applying electrode that is provided between the deflector and the electrostatic lens and to which a constant voltage having a same sign with the voltage applied to the electrostatic lens is applied.

7 Claims, 10 Drawing Sheets

FIG. 2

| OPTICAL MODE A | | |
|---|---|---|
| ACCELERATION VOLTAGE [V] | X RATE | Y RATE |
| $V_1$ | $X_{1A}$ | $Y_{1A}$ |
| $V_2$ | $X_{2A}$ | $Y_{2A}$ |
| $V_3$ | $X_{3A}$ | $Y_{3A}$ |
| ⋮ | | |
| $V_N$ | $X_{NA}$ | $Y_{NA}$ |

CHARGED PARTICLE BEAM APPARATUS

CROSS-REFERENCE

The present application is based on, and claims priority from Japanese Patent Application Serial Number 2018-181729, filed Sep. 27, 2018, the disclosure of which is hereby incorporated by reference herein in its entirety

BACKGROUND OF THE INVENTION

1. Field of the Invention

The present invention relates to a charged particle beam apparatus, and particularly relates to a technique for correcting an aberration or a defocus of an electron beam with which a specimen is irradiated.

2. Description of the Related Art

A charged particle beam apparatus irradiates a specimen with a charged particle beam such as an electron beam and observes or processes the specimen. A scanning electron microscope which is a charged particle beam apparatus generates an observation image by detecting secondary electrons or reflected electrons emitted from the specimen while scanning the specimen with the electron beam by a deflector. A spatial resolution of the image generated by the scanning electron microscope is improved as a size of irradiation on the specimen with the electron beam is smaller, and is lowered due to the aberration or the defocus of the electron beam. That is, in order to improve the spatial resolution of the image, it is necessary to correct the aberration or the defocus of the electron beam.

JP-A-2008-181786 (Patent Literature 1) discloses that an electrostatic lens that forms a magnetic path of an objective lens is provided between the objective lens which is a magnetic field lens and a specimen, and an aberration or a defocus is corrected by adjusting a voltage applied to each electrode of a plurality of divided electrostatic lenses.

However, Patent Literature 1 does not mention an influence on the deflector by a fluctuation in an electric field formed by the electrostatic lens. When the electric field formed by the electrostatic lens is in an area where the deflector interferes with the scanning of the electron beam, an irradiation position of the electron beam is shifted due to the fluctuation in the electric field, and a disturbance occurs in the generated image. In order to avoid interference with the deflector, the aberration in the objective lens is apparent if the area of the electric field formed by the electrostatic lens is too narrow.

SUMMARY OF THE INVENTION

An object of the invention is to control an influence on a deflector by a fluctuation in an electric field of an electrostatic lens and correct an aberration or a defocus of an electron beam for irradiation.

In order to achieve the above object, the invention provides a charged particle beam apparatus including a deflector that deflects a charged particle beam with which a specimen is irradiated, an objective lens that focuses the charged particle beam on the specimen, an electrostatic lens that includes a part of the objective lens and to which a voltage for correcting the aberration or the defocus of the charged particle beam is applied, and a constant electric field applying electrode that is provided between the deflector and the electrostatic lens and to which a constant voltage having a same sign with the voltage applied to the electrostatic lens is applied.

According to the invention, the influence on the deflector by the fluctuation in the electrostatic lens can be controlled and the aberration or the defocus of the electron beam for irradiation can be corrected.

BRIEF DESCRIPTION OF THE DRAWINGS

FIG. 2 is a diagram showing an example of a table for adjusting a deflector according to the first embodiment.

DESCRIPTION OF THE PREFERRED EMBODIMENTS

Embodiments of a charged particle beam apparatus according to the invention will be described below with reference to the drawings. The charged particle beam apparatus is an apparatus that irradiates a specimen with a charged particle beam and observes or processes the specimen, and includes various apparatuses such as a scanning electron microscope that generates an image for observing the specimen by scanning the specimen with an electron beam. Hereinafter, the scanning electron microscope will be described as an example of the charged particle beam apparatus.

First Embodiment

Figure 1:
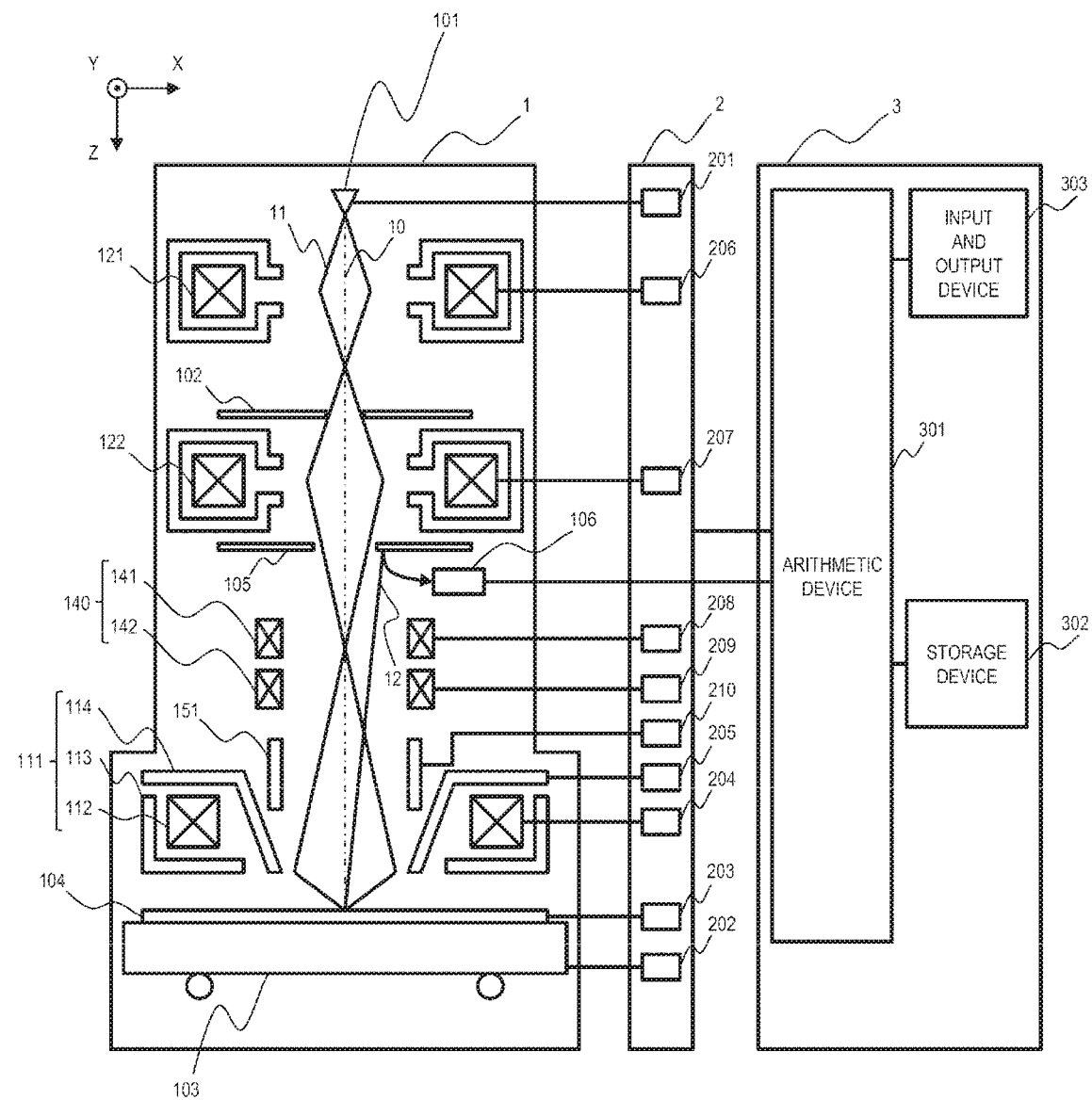
FIG. 1 is a schematic diagram of a scanning electron microscope which is an example of a charged particle beam apparatus according to a first embodiment.

An overall configuration of the scanning electron microscope in the first embodiment will be described with reference to FIG. 1. The scanning electron microscope includes an electron optical column 1, a power supply unit 2, and a control unit 3. In FIG. 1, a vertical direction is referred to as a Z direction, and a horizontal direction is referred to as an X direction and a Y direction.

The electron optical column 1 includes an electron source 101, a specimen stage 103, a detector 106, an objective lens 111, a first condenser lens 121, a second condenser lens 122, a deflector 140, and a constant electric field applying electrode 151. A specimen 104 to be observed is placed on the specimen stage 103. The objective lens 111 includes a coil 112, a lower magnetic path 113, and an upper magnetic path 114. The deflector 140 includes a first deflector 141 and a second deflector 142. The objective lens 111, the first condenser lens 121, the second condenser lens 122, and the constant electric field applying electrode 151 have a continuous rotating body structure with an optical axis 10 as a rotation axis, and the first deflector 141 and the second deflector 142 have a rotating body structure of fourfold symmetry with the optical axis 10 as a rotation axis.

The power supply unit 2 supplies power to components of the electron optical column 1. The power supply unit 2 includes control power supplies 201 to 210 connected to components of the electron optical column 1. The control power supplies 201, 203, 205, and 210 respectively control voltages applied to the electron source 101, the specimen 104, the upper magnetic path 114, and the constant electric field applying electrode 151. The control power supply 202 controls a movement of the specimen stage 103 on an XY plane. The control power supplies 204, 206, 207, 208, and 209 respectively control currents that excite the coil 112, the first condenser lens 121, the second condenser lens 122, the first deflector 141, and the second deflector 142.

The control unit 3 controls the entire scanning electron microscope. The control unit 3 includes an arithmetic device 301, a storage device 302, and an input and output device 303. The arithmetic device 301 executes a predetermined arithmetic processing according to a program stored in the storage device 302. The arithmetic device 301 is, for example, a Central Processing Unit (CPU), or a Graphics Processing Unit (GPU). The storage device 302 stores a program executed by the arithmetic device 301, data used by the program, and data processed by the arithmetic device 301. The storage device 302 includes a temporary storage area such as a work area used by the program. The storage device 302 is a main recording device such as a Random Access Memory (RAM), or an auxiliary storage device such as a Hard Disk Drive (HDD), or a Solid State Drive (SSD). The input and output device 303 inputs and outputs data, and includes a keyboard, a mouse, a touch panel, a display, and the like.

A primary electron beam 11 is emitted from the electron source 101 in the electron optical column 1. The primary electron beam 11 is sequentially received by magnetic fields formed by the first condenser lens 121, the second condenser lens 122, and the objective lens 111, and is focused on the specimen 104. That is, the focus of the primary electron beam 11 is adjusted by the three lenses. At this time, a probe current of the primary electron beam 11 which passes through a current limit stop 102 is controlled by the first condenser lens 121, and an opening angle of the primary electron beam 11 on the specimen 104 is controlled by the second condenser lens. Further, in addition to an electric field formed by the objective lens 111, electric fields are formed on a trajectory of the primary electron beam 11 by the upper magnetic path 114, the specimen 104, and the constant electric field applying electrode 151 to which voltages are independently applied, respectively.

The deflector 140 is used as a scanning deflector that deflects the primary electron beam 11 to two-dimensionally scan the specimen 104, and a visual field setting deflector that can arbitrarily set a range in which the specimen 104 is scanned two-dimensionally. It should be noted that the deflector of the scanning deflector and the deflector of the visual field setting deflector may be arranged independently.

The control power supply 208 and the control power supply 209 respectively apply, to the first deflector 141 and the second deflector 142, currents which are calculated by the arithmetic device 301 according to an indicated value of a deflection amount of the primary electron beam 11 on the specimen 104. The indicated value of the deflection amount of the primary electron beam 11 may be stored in the storage device 302 in advance, may be read out according to a control condition, and may be input from the input and output device 303. The arithmetic device 301 calculates currents so as to be in an operation ratio based on a numerical value of adjustment data stored in the storage device 302 in advance.

FIG. 2 shows an example of the adjustment data. The adjustment data in FIG. 2 is an example in which the X ratio and the Y ratio which are ratios of the respective directions are stored for each acceleration voltage of the primary electron beam 11 in a configuration in which the first electron beam is defected in any direction using a deflector that acts in the X direction and a deflector that acts in the Y direction. Since the adjustment data related to the deflector is stored for each acceleration voltage, it is easy to control the deflection of the primary electron beam 11.

Signal electrons 12 such as secondary electrons or reflected electrons emitted from the specimen 104 when the specimen 104 is scanned with the primary electron beam 11 collide with a reflection plate 105, and then are detected by the detector 106, as tertiary electrons or reflected electrons generated from the reflection plate. Here, in order to increase the signal electrons 12 which collide with the reflection plate 105, an ExB deflector that deflects the signal electrons 12 only and does not act on the primary electron beam 11 may be arranged on an upstream side in a traveling direction of the signal electrons 12. In order to directly detect the signal electrons 12 by the detector 106, the signal electrons 12 may be further deflected by the ExB deflector. The arithmetic device 301 generates an image for observing the specimen 104 by mapping an intensity of the signal electrons 12 detected by the detector 106 as two-dimensional information associated with each irradiation position of the primary electron beam 11. The generated image is displayed on the input and output device 303, and is stored in the storage device 302.

The specimen stage 103 on which the specimen 104 is placed can two-dimensionally move in an XY plane which is a plane perpendicular to the optical axis 10. That is, an observation position can be changed by moving the irradiation position of the primary electron beam 11 on the specimen 104 by the specimen stage 103. At this time, a distance between an observation position of the specimen 104 and the objective lens 111 (hereinafter, a height of the specimen 104) may change due to shapes of the specimen stage 103 or the specimen 104. Specifically, the height of the specimen 104 changes when a contact surface between the specimen stage 103 and the specimen 104 is inclined with respect to the XY plane, or when a surface of the specimen 104 is deflected by a dead weight of the specimen 104 or pressure generated in the specimen 104. When the height of the specimen 104 changes due to a movement of the specimen stage 103, the primary electron beam 11 is not focused on the specimen 104 and a defocus occurs under a focusing condition adjusted before the observation position is changed, so that a generated image is blurred. Therefore, in the first embodiment, a voltage applied to the upper magnetic path 114 fluctuates to cause the upper magnetic path 114 to function as an electrostatic lens so as to correct the defocus. Since the constant electric field applying electrode 151 is arranged between the upper magnetic path 114 which is the electrostatic lens and the deflector 140, fluctuation in an electric field formed by the upper magnetic path 114 is shielded by the constant electric field applying electrode 151 and does not reach the deflector 140. A constant voltage is applied to the constant electric field applying electrode 151 regardless of the fluctuation of the voltage applied to the upper magnetic path 114.

Figure 3:
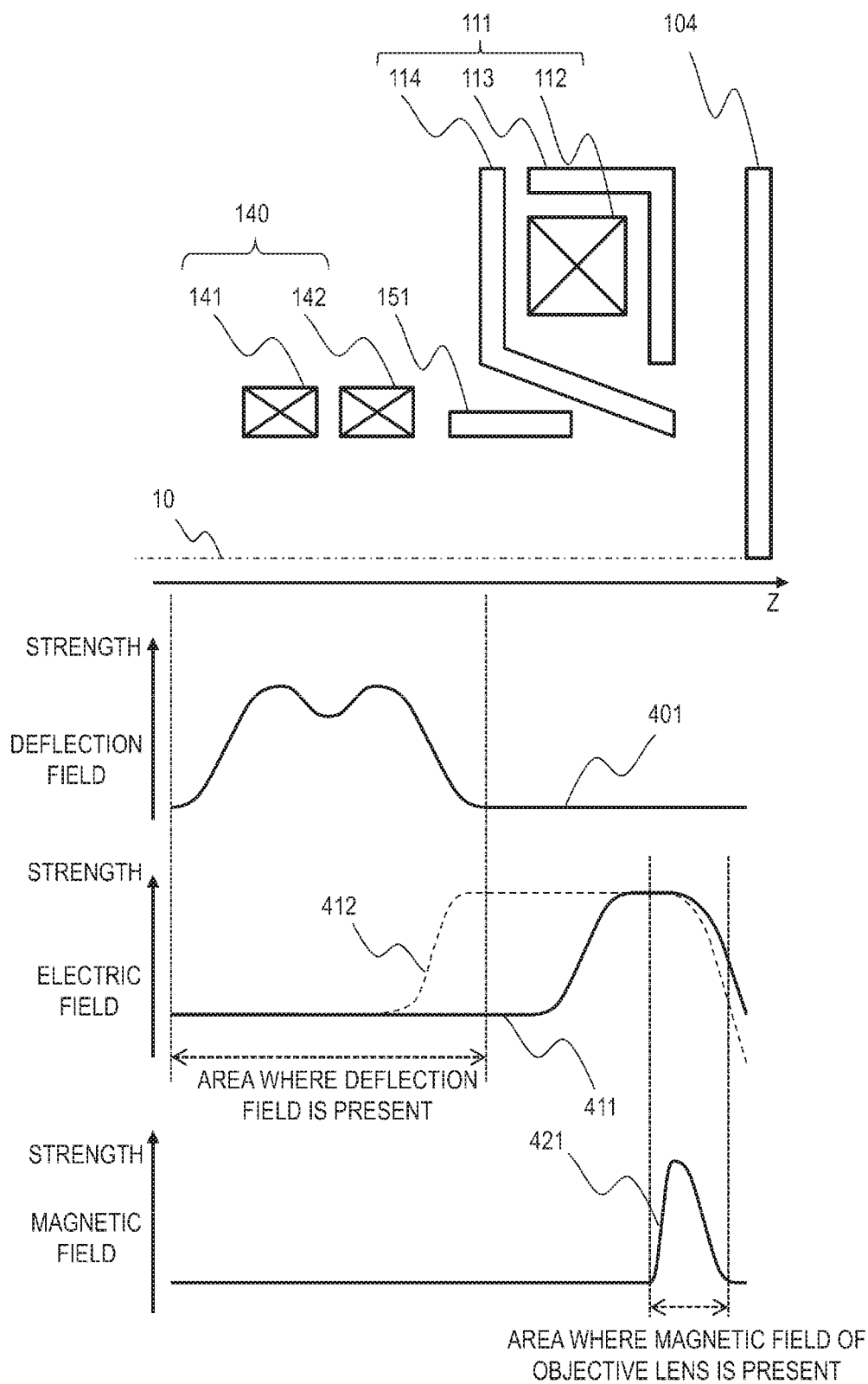
FIG. 3 is a schematic diagram showing a relationship between an electric field and a magnetic field on an optical axis according to the first embodiment.

A relationship, on the optical axis 10, among a deflection field 401 formed by the deflector 140, an electric field 411 formed by the upper magnetic path 114 which is the electrostatic lens, and a magnetic field 421 formed by the objective lens 111 will be described with reference to FIG. 3. The deflection field 401 may be a magnetic field or an electric field, and is a magnetic field in the first embodiment. In FIG. 3, a synthesized electric field 412 that is formed by synthesizing an electric field formed by applying a negative voltage to the specimen 104, an electric field formed by applying a positive voltage to the constant electric field applying electrode 151, and the electric field 411 is shown by a dotted line. The arrangement of the objective lens 111, the specimen 104, the constant electric field applying electrode 151, and the deflector 140 is also shown in FIG. 3 for comparison with the electric field and the magnetic field. As a comparative example with FIG. 3, a configuration in which the constant electric field applying electrode 151 is removed is shown in FIG. 4, and FIG. 4 will be described below in comparison with FIG. 3.

Figure 4:
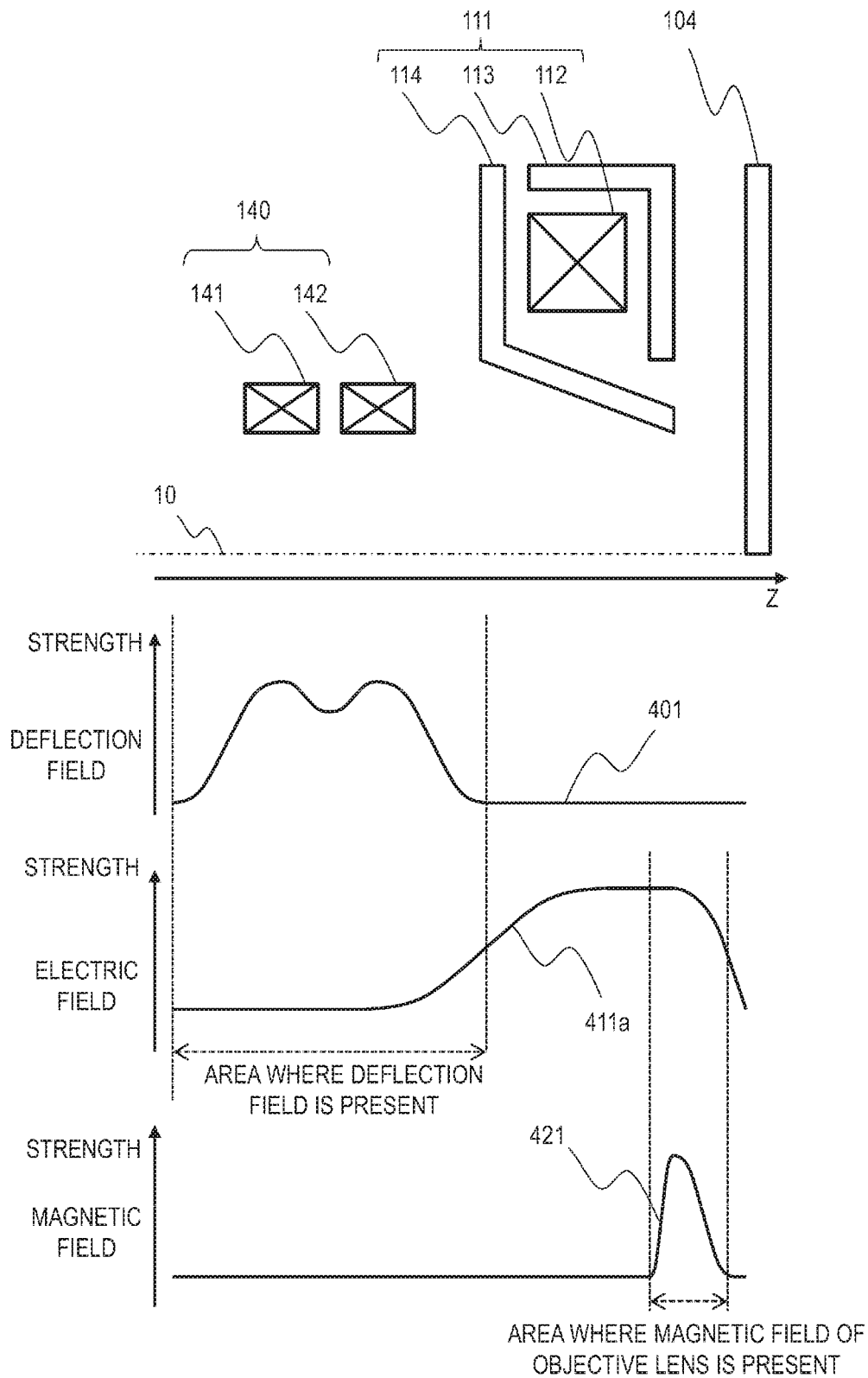
FIG. 4 is a schematic diagram showing a relationship between an electric field and a magnetic field on the optical axis according to a comparative example.

In FIG. 4, since a part of an electric field 411a formed by the electrostatic lens overlaps an area where the deflection field 401 is present, when the electric field 411a fluctuates to correct the defocus, an irradiation position of the primary electron beam 11 is shifted due to the fluctuation of the electric field 411a that overlaps the deflection field 401, and disturbance occurs in the generated image. On the other hand, in FIG. 3, since the constant electric field applying electrode 151 is arranged between the electrostatic lens and the deflector 140, the electric field 411 formed by the electrostatic lens does not overlap the area where the deflection field 401 is present, and since the irradiation position of the primary electron beam 11 is not shifted even when the electric field 411 fluctuates, no disturbance occurs in the image. Further, since the electric field 411 includes an area where the magnetic field 421 formed by the objective lens 111 is present, the defocus caused by a slight fluctuation in the electric field 411 can be corrected, which is advantageous in terms of correcting the aberration.

Since the aberration in the objective lens 111 is apparent when an area of the electric field 411 formed by the electrostatic lens is narrowed, a part of the synthetized electric field 412 overlaps on the area where the deflection field 401 is present by applying, to the constant electric field applying electrode 151, a constant voltage having the same sign with the voltage applied to the electrostatic lens. Since the voltage applied to the constant electric field applying electrode 151 is constant, the synthesized electric field 412 does not fluctuates in the area overlapping the deflection field 401, and no disturbance occurs in the image.

The voltage applied to the constant electric field applying electrode 151 is preferably set to allow a shape of the synthesized electric field 412 to be approximate to a shape of the electric field 411a formed by the electrostatic lens when the constant electric field applying electrode 151 is not arranged. When the shape of the synthesized electric field 412 is approximate to the shape of the electric field 411a, various optical conditions set when the constant electric field applying electrode 151 is not arranged, for example, the adjustment data related to the deflector as shown in FIG. 2, can also be used when the constant electric field applying electrode 151 is arranged. That is, although the voltage applied to the constant electric field applying electrode 151 may be set for each optical condition such as an acceleration voltage, the voltage remains at a constant value when the defocus or the like is corrected.

Figure 5:
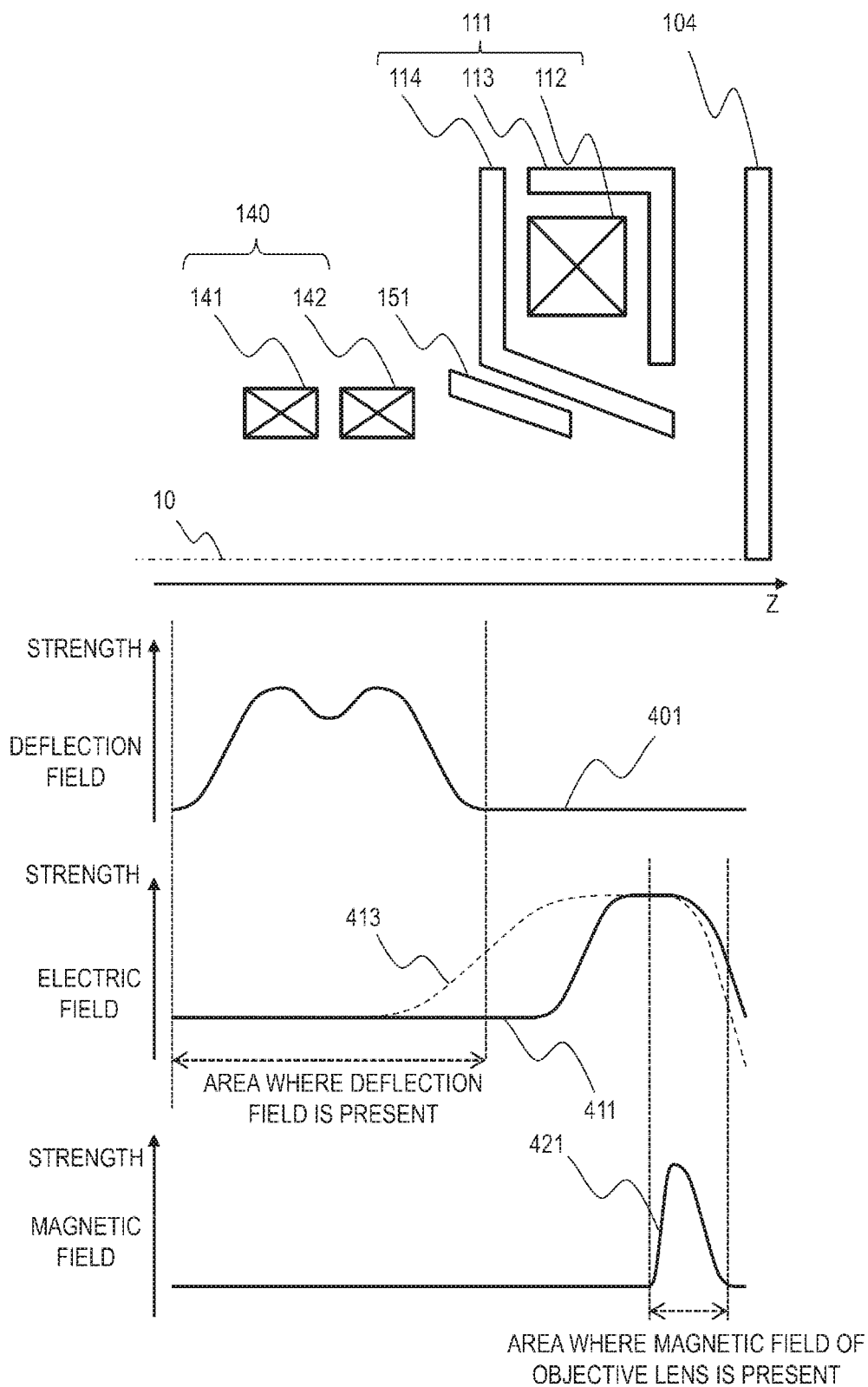
FIG. 5 is a schematic diagram showing a relationship between an electric field and a magnetic field on the optical axis according to a modification of the first embodiment.

A modification of the constant electric field applying electrode 151 will be described with reference to FIG. 5. The constant electric field applying electrode 151 in FIG. 5 is formed along a shape of the upper magnetic path 114 which is an electrostatic lens and more preferably the constant electric field applying electrode 151 is arranged in parallel to the upper magnetic path 114. With such a configuration, a shape of a synthesized electric field 413 that is formed by synthesizing the electric field formed by the specimen 104, the electric field formed by the constant electric field applying electrode 151, and the electric field 411 formed by the electrostatic lens is approximate to the shape of the electric field 411a formed by the electrostatic lens when the constant electric field applying electrode 151 is not arranged. That is, the various optical conditions set when the constant electric field applying electrode 151 is not arranged can also be easily used when the constant electric field applying electrode 151 is arranged.

As described above, the defocus of the primary electron beam 11 can be corrected and an influence on the deflector 140 by the fluctuation in the electric field of the electrostatic lens can be controlled by arranging the constant electric field applying electrode 151 between the upper magnetic path 114 which functions as the electrostatic lens and the deflector 140 in the first embodiment. As a result, a clear and undisturbed image for observation can be obtained. Further, the shape of the synthesized electric field that is formed by synthesizing the electric field formed by the specimen 104, the electric field formed by the constant electric field applying electrode 151, and the electric field 411 formed by the electrostatic lens is brought approximate to the shape of the electric field 411a, so that it is not necessary to reset the various optical conditions set when the constant electric field applying electrode 151 is not presented.

Second Embodiment

In the first embodiment, the constant electric field applying electrode 151 is arranged between the upper magnetic path 114 which functions as an electrostatic lens and the deflector 140, and a constant voltage is applied to the constant electric field applying electrode 151. In the second embodiment, a constant electric field applying electrode arranged between the upper magnetic path 114 which functions as an electrostatic lens and the deflector 140 is divided in an irradiation direction of the primary electron beam 11, and a voltage is independently applied to each divided electrode.

Figure 6:
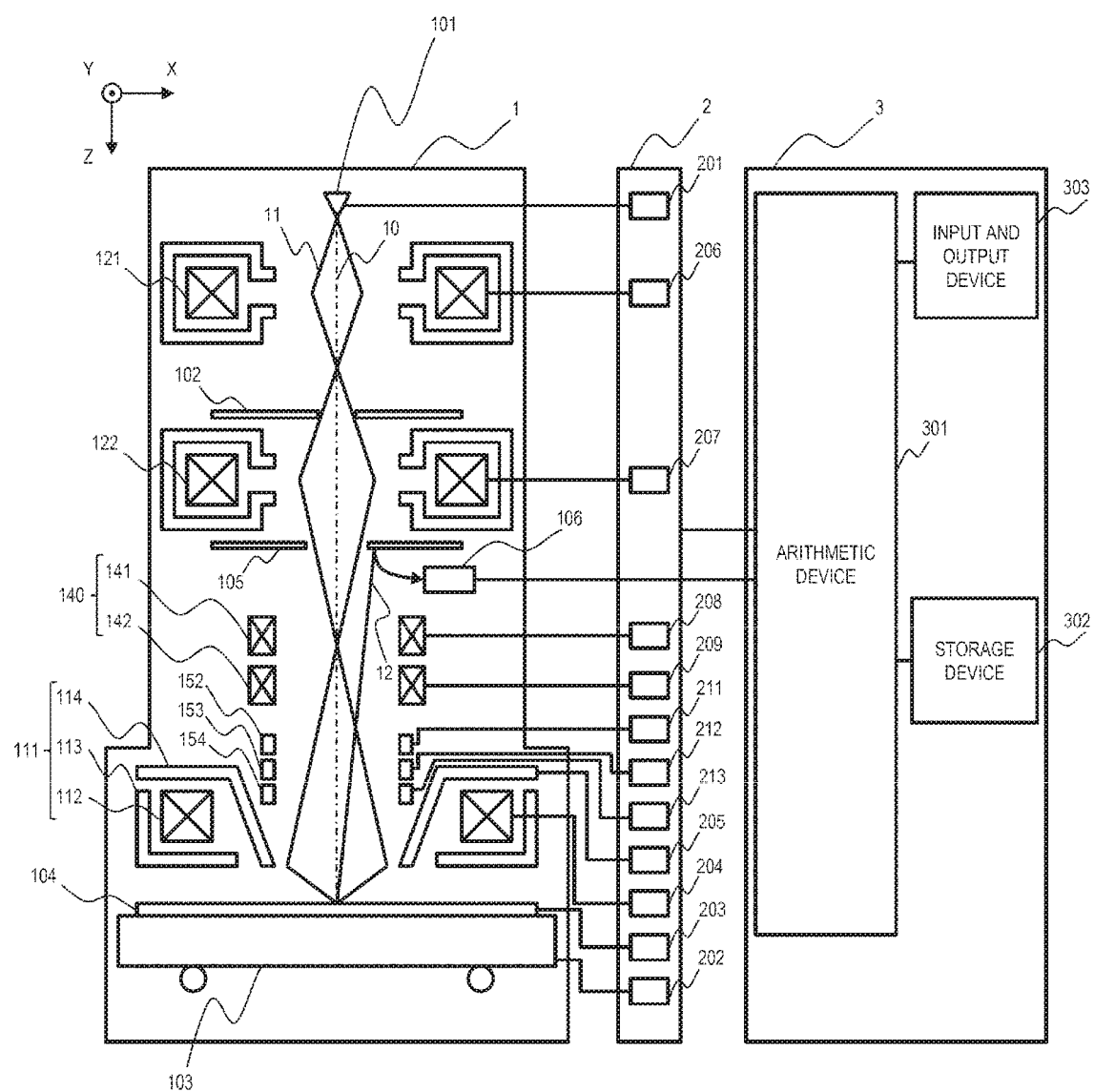
FIG. 6 is a schematic diagram of a scanning electron microscope which is an example of a charged particle beam apparatus according to a second embodiment.

A configuration of a scanning electron microscope in the second embodiment will be described with reference to FIG. 6. The same components as those in the first embodiment are denoted by the same reference numerals, and the description thereof is omitted. The scanning electron microscope in the second embodiment includes three constant electric field applying electrodes 152, 153, and 154 instead of the constant electric field applying electrode 151 in the first embodiment, and control power supplies 211, 212, and 213 instead of the control power supply 210 in the first embodiment. The constant electric field applying electrodes 152, 153, and 154 have the same inner diameter and the same outer diameter, and are arranged along the optical axis 10 and between the upper magnetic path 114 which functions as the electrostatic lens and the deflector 140. The control power supplies 211, 212, and 213 are respectively connected to the constant electric field applying electrodes 152, 153, and 154, and control voltages applied to the electrodes. Independent voltages can be respectively applied to the constant electric field applying electrodes 152, 153, and 154 by the control power supplies 211, 212, and 213.

Figure 7:
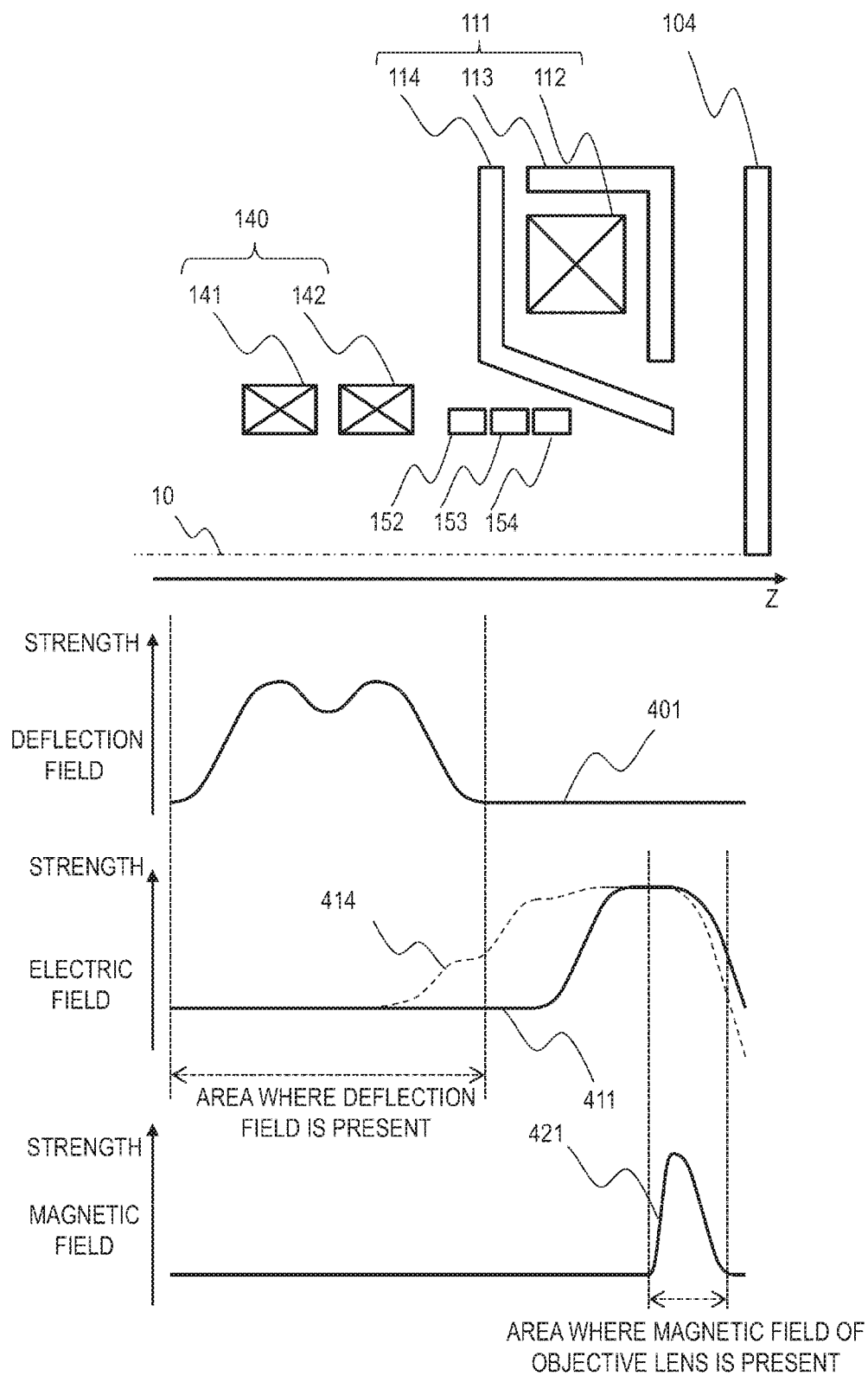
FIG. 7 is a schematic diagram showing a relationship between an electric field and a magnetic field on the optical axis according to the second embodiment.

The relationship, on the optical axis 10, among the deflection field 401 formed by the deflector 140, the electric field 411 formed by the upper magnetic path 114 which is the electrostatic lens, and the magnetic field 421 formed by the objective lens 111 will be described with reference to FIG. 7. In FIG. 7, the synthesized electric field 414 that is formed by synthesizing an electric field formed by applying a negative voltage to the specimen 104, an electric field formed by applying a positive voltage to the constant electric field applying electrodes 152, 153, and 154, and the electric field 411 is shown by a dotted line. FIG. 7 will be described below in comparison with FIG. 4.

Similar to the first embodiment, since the constant electric field applying electrodes 152, 153, and 154 are arranged between the electrostatic lens and the deflector 140, the electric field 411 formed by the electrostatic lens does not overlap the area where the deflection field 401 is present. Therefore, even if the electric field 411 fluctuates to correct the defocus, the irradiation position of the primary electron beam 11 is not shifted, so that no disturbance occurs in the generated image. Similar to the first embodiment, since the electric field 411 includes the area where the magnetic field 421 formed by the objective lens 111 is present, the defocus caused by a slight fluctuation in the electric field 411 can be corrected.

Further, since different voltages can be applied to the constant electric field applying electrodes 152, 153, and 154 respectively in the second embodiment, the shape of the synthesized electric field 414 can be easily controlled. For example, when a positive voltage of which an absolute value increases is sequentially applied to the constant electric field applying electrodes 152, 153, and 154, that is, when a high voltage is applied as approaching the specimen 104, the shape of the synthesized electric field 414 is stepped as shown in FIG. 7 and is approximate to the shape of the electric field 411*a* in FIG. 4. As a result, the various optical conditions set when the constant electric field applying electrodes 152, 153, and 154 are not arranged can also be used when the constant electric field applying electrodes 152, 153, and 154 are arranged.

As described above, since the constant electric field applying electrodes 152, 153, and 154 are arranged between the upper magnetic path 114 which functions as the electrostatic lens and the deflector 140 in the second embodiment, similar to the first embodiment, the defocus can be corrected, and the interference with the deflector 140 caused by fluctuation in the electric field of the electrostatic lens can be prevented. As a result, a clear and undisturbed image for observation can be obtained. Further, since the shape of the synthesized electric field 414 is easily brought approximate to the shape of the electric field 411*a*, it is not necessary to reset the various optical conditions set when the constant electric field applying electrode 151 is not arranged. The division number of the constant electric field applying electrode is not limited to three described in the second embodiment, and the same effect as in the second embodiment can be obtained as long as the division number is two or more.

Third Embodiment

In the second embodiment, the constant electric field applying electrode arranged between the upper magnetic path 114 which functions as the electrostatic lens and the deflector 140 is divided in the irradiation direction of the primary electron beam 11. In the third embodiment, a constant electric field applying electrode arranged between the upper magnetic path 114 which functions as the electrostatic lens and the deflector 140 is divided in a circumferential direction of the optical axis 10, and a voltage is independently applied to each divided electrode. The same components as those in the first embodiment are denoted by the same reference numerals, and the description thereof is omitted.

Figure 8A:
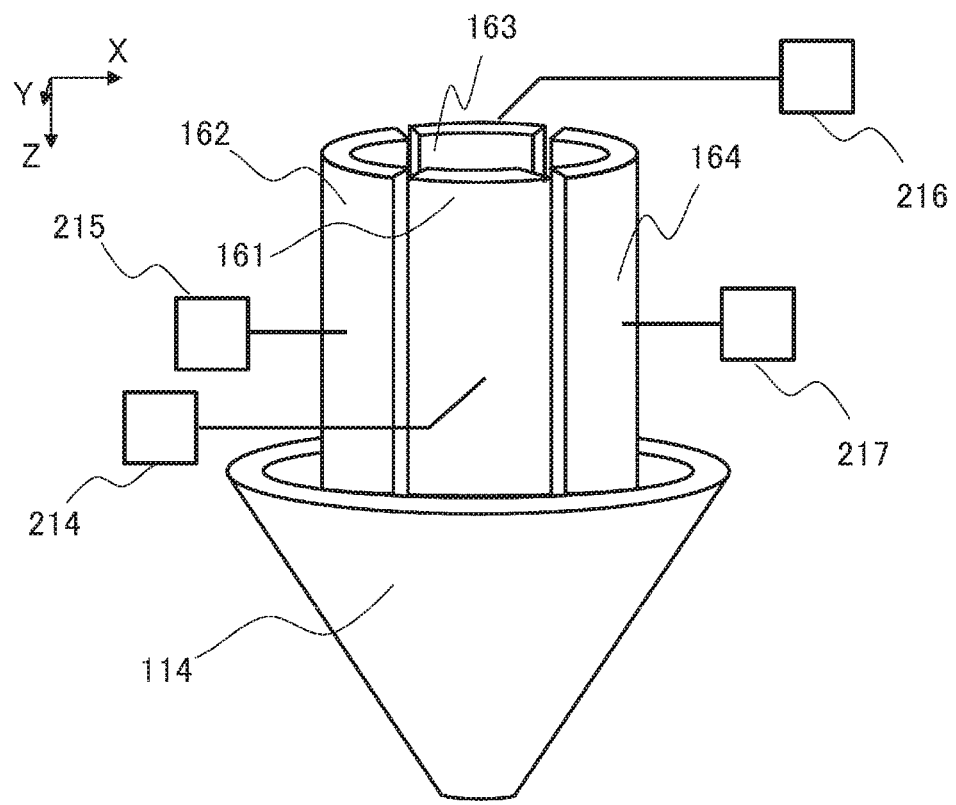
FIGS. 8A and 8B are schematic diagrams showing a structure of a constant electric field applying electrode according to a third embodiment.
Figure 8B:
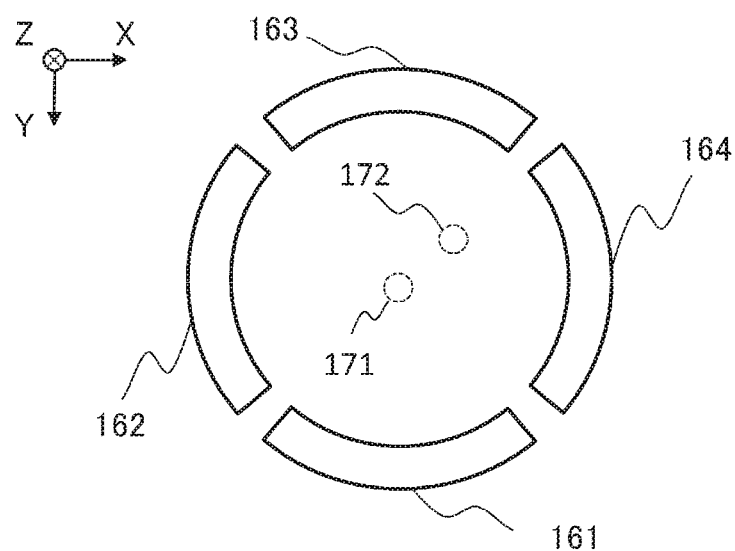

The constant electric field applying electrodes 161, 162, 163, and 164 in the third embodiment will be described with reference to FIGS. 8A and 8B. The constant electric field applying electrodes 161, 162, 163, and 164 are arranged on an electron source 101 side of the upper magnetic path 114 and have a quadrupole structure of fourfold symmetry. Control power supplies 214, 215, 216, and 217 are connected to the constant electric field applying electrodes 161, 162, 163, and 164, respectively, and voltages are independently applied thereto.

Depending on an accuracy of assembling the constant electric field applying electrodes 161, 162, 163, and 164 and the upper magnetic path 114, an axis of rotational symmetry 171 of the constant electric field applying electrodes 161, 162, 163, and 164 may be deviated from an axis of rotational symmetry 172 of the upper magnetic path 114. When the axis of rotational symmetry 171 is deviated from the axis of rotational symmetry 172, a lens center of the objective lens 111 is also deviated from a lens center of the synthesized electric field formed by synthesizing electric fields such as electric fields formed by the constant electric field applying electrodes 161, 162, 163, and 164. Since the off-axis aberration of the primary electron beam 11 passing through the objective lens 111 and the like increases, the generated image is unclear.

Therefore, in the third embodiment, the voltages applied to the constant electric field applying electrodes 161, 162, 163, and 164 are adjusted by the control power supplies 214, 215, 216, and 217 such that the lens center of the synthesized electric field is aligned with the axis of rotational symmetry 172 of the upper magnetic path 114. A lens axis deviation can be corrected, and the aberration of the primary electron beam 11 with which the specimen 104 is irradiated can be corrected by aligning the lens center of the synthesized electric field with the axis of rotational symmetry 172. It should be noted that the voltages applied to the constant electric field applying electrodes 161, 162, 163, and 164 remain constant when the defocus or the like is corrected.

Although it is described that the constant electric field applying electrodes 161, 162, 163, and 164 are quadrupole in the third embodiment, the same effect as in the third embodiment can be obtained as long as the constant electric field applying electrode has four or more poles. Further, each of the constant electric field applying electrodes 152, 153, and 154 described in the second embodiment may have a multipole structure with four or more poles.

As described above, according to the third embodiment, the defocus can be corrected using the upper magnetic path 114 which functions as the electrostatic lens without increasing the aberration generated in the primary electron beam 11 which is deflected and focused on the specimen 104. Further, since the constant electric field applying electrodes 161, 162, 163, and 164 are arranged between the upper magnetic path 114 and the deflector 140, similar to the first embodiment, interference with the deflector 140 caused by the fluctuation in the electric field of the electrostatic lens can be prevented.

Fourth Embodiment

In the first embodiment, the specimen 104 is not moved in a direction of the optical axis 10. Depending on an observation purpose, the specimen 104 may be moved in parallel to the optical axis 10. When a distance between the specimen 104 and the objective lens 111 is changed, a distortion aberration may occur with a change in an electric field around the specimen 104 in addition to resetting a focusing condition of the primary electron beam 11. In the fourth embodiment, the distortion aberration caused by the movement of the specimen stage 103 in the direction of the optical axis 10 is reduced.

A configuration of a scanning electron microscope according to the fourth embodiment will be described with reference to FIG. 9. The same components as those in the first embodiment are denoted by the same reference numerals, and the description thereof is omitted. The scanning electron microscope in the fourth embodiment includes those configurations in the first embodiment, and further includes a distance changing unit 107, a specimen side electrode 115, and control power supplies 218 and 219.

The distance changing unit 107 is mounted with the specimen 104 and moves the specimen 104 in parallel to the optical axis 10, and is mounted on the specimen stage 103. The control power supply 219 controls an operation of the distance changing unit 107. The control power supply 219 controls the operation of the distance changing unit 107 to adjust a distance between the specimen 104 and the objective lens 111.

The specimen side electrode 115 is arranged between the specimen 104 and the objective lens 111, and voltages are applied independently to the upper magnetic path 114, the specimen 104, and the constant electric field applying electrode 151. The control power supply 218 is connected to the specimen side electrode 115 and controls a voltage applied to the specimen side electrode 115. The control power supply 218 may control the voltage applied to the specimen side electrode 115 according to the distance between the specimen 104 and the objective lens 111.

Figure 9:
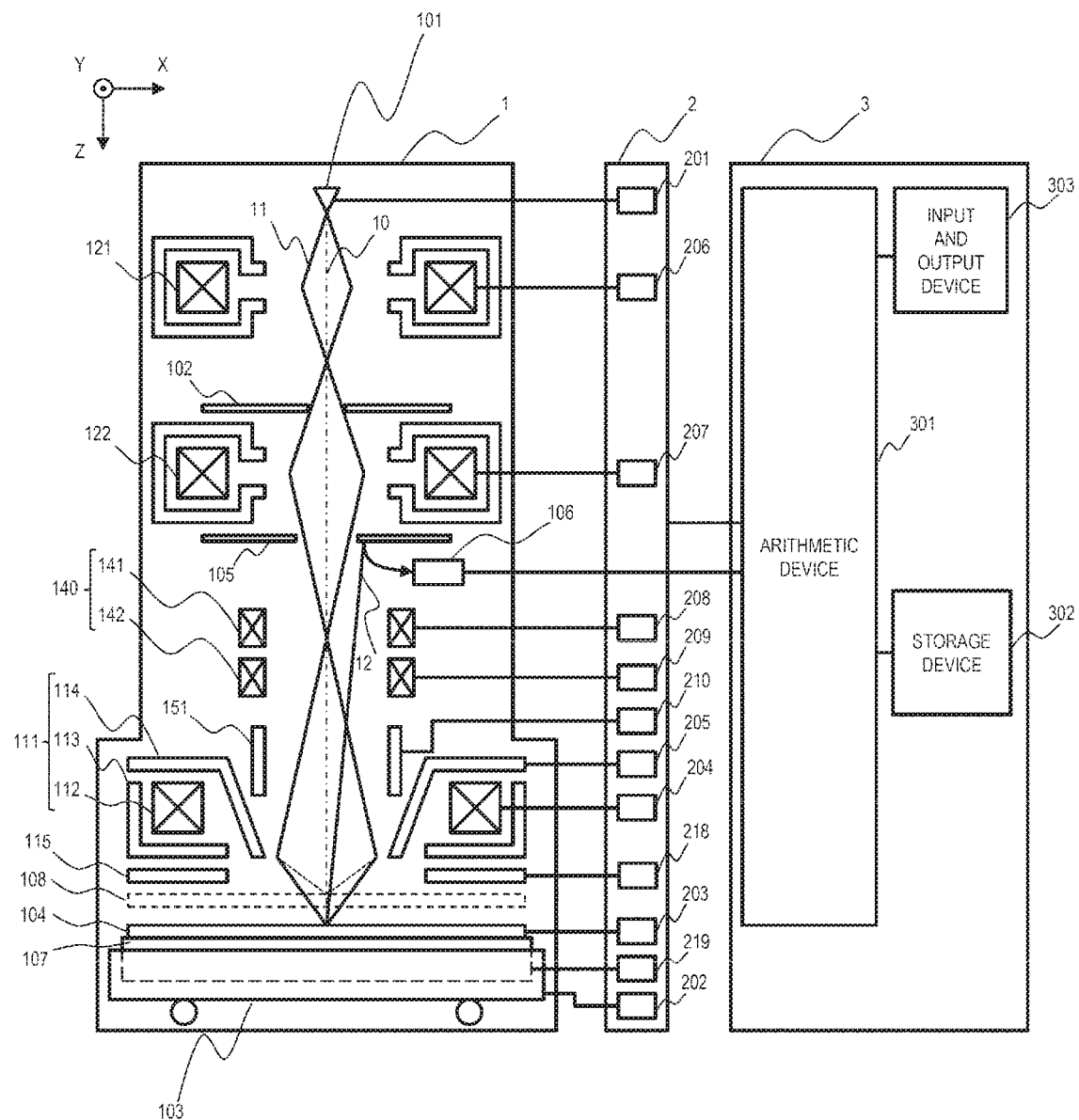
FIG. 9 is a schematic diagram of a scanning electron microscope which is an example of a charged particle beam apparatus according to a fourth embodiment.

In FIG. 9, a first specimen position 108 which is a position before the specimen 104 is moved is shown by a broken line, and the specimen 104 is disposed at a position moved on the order of millimeters. A relatively large defocus caused by moving the specimen 104 in the direction of the optical axis 10 by the operation of the distance changing unit 107 is corrected by adjusting a magnetic field of the objective lens 111. A relatively small defocus caused by moving the specimen stage 103 in the XY plane is corrected by adjusting an electric field of the upper magnetic path 114.

Figure 10:
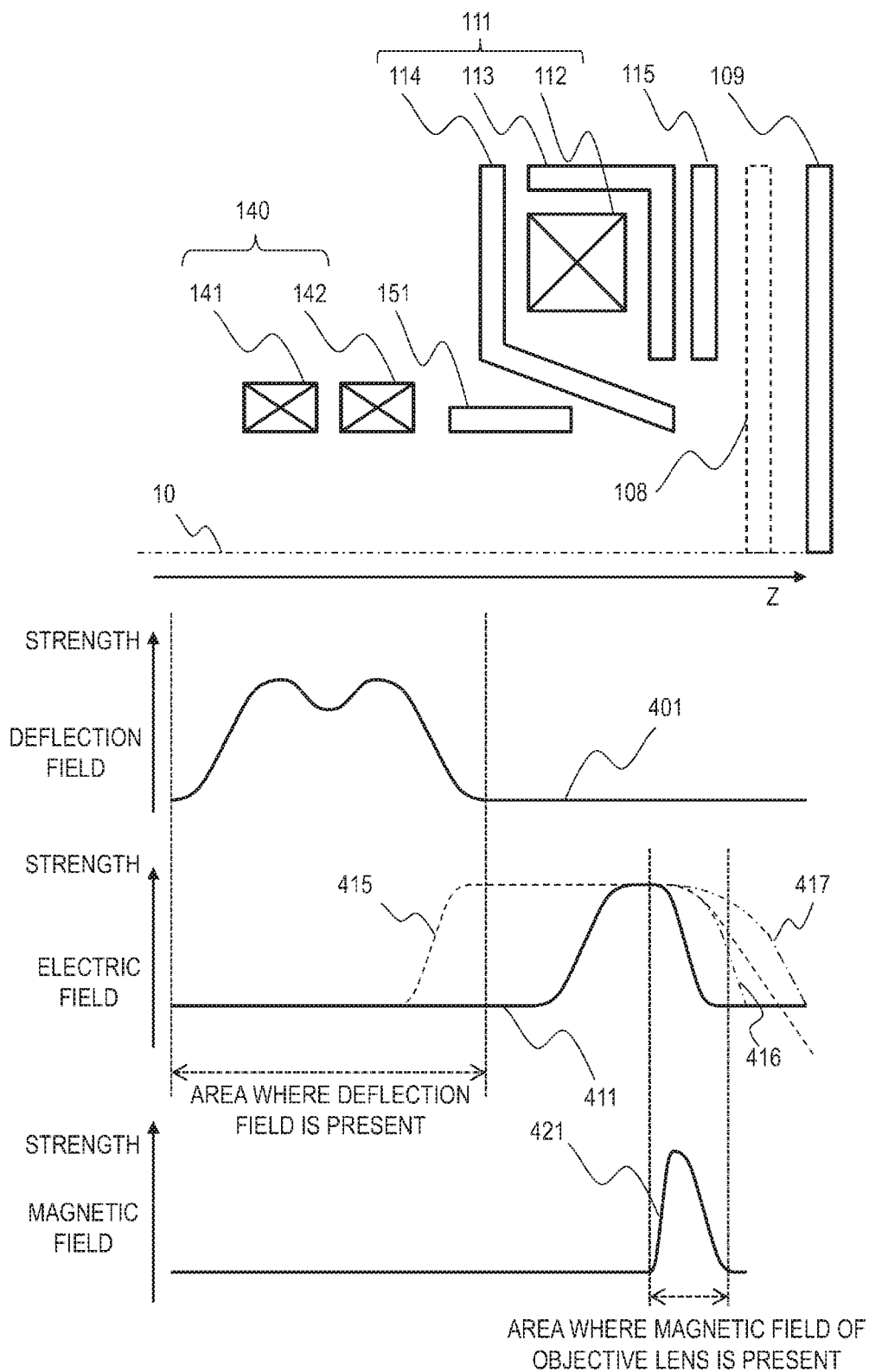
FIG. 10 is a schematic diagram showing a relationship between an electric field and a magnetic field on the optical axis according to the fourth embodiment.

The relationship between the electric field and the magnetic field on the optical axis 10 in the fourth embodiment will be described with reference to FIG. 10. In FIG. 10, a synthesized electric field 415 that is formed by synthesizing an electric field formed by applying a positive voltage to the constant electric field applying electrode 151 and the specimen side electrode 115, an electric field formed by applying a negative voltage to the specimen 104, and the electric field 411 formed by the upper magnetic path 114 is shown by a dotted line. Further, in order to compare the electric field and the magnetic field, FIG. 10 shows an arrangement of the first specimen position 108, a second specimen position 109, the specimen side electrode 115, the objective lens 111, the constant electric field applying electrode 151, and the deflector 140. The deflection field 401 formed by the deflector 140 and the magnetic field 421 formed by the objective lens 111 are similar to those in the first embodiment.

Here, an electric field around the specimen 104 when the specimen side electrode 115 is not arranged will be described. A specimen side electric field formed on the optical axis 10 by the upper magnetic path 114 is shown by a broken line 416 when the specimen 104 is in the first specimen position 108, and is shown by a broken line 417 when the specimen 104 is in the second specimen position 109. That is, when the distance between the specimen 104 and the objective lens 111 is adjusted by the distance changing unit 107, the specimen side electric field formed by the upper magnetic path 114 changes. A change in the specimen side electric field may cause a distortion aberration.

Therefore, the electric field 411 formed by the upper magnetic path 114 is confined between the constant electric field applying electrode 151 and the specimen side electrode 115 by disposing the specimen side electrode 115 in the fourth embodiment. That is, even when the distance between the specimen 104 and the objective lens 111 is adjusted by the distance changing unit 107, a shape of the electric field 411 formed by the upper magnetic path 114 on the specimen 104 side remains substantially constant by disposing the specimen side electrode 115. The voltage applied to the specimen side electrode 115 may be adjusted to keep the shape of the electric field 411 on the specimen 104 side constant. For example, the voltage applied to the specimen side electrode 115 may be controlled according to the distance between the specimen 104 and the objective lens 111. The distortion aberration can be reduced by keeping the shape of the electric field 411 on the specimen 104 side constant.

Further, the voltage applied to the specimen side electrode 115 may be a negative voltage. The electric field 411 formed by the upper magnetic path 114 is easily confined between the constant electric field applying electrode 151 and the specimen side electrode 115 by applying, to the specimen side electrode 115, a voltage having a sign different from the voltage applied to the upper magnetic path 114 which is the electrostatic lens.

As described above, according to the fourth embodiment, even when the distance between the specimen 104 and the objective lens 111 changes with the movement of the specimen stage 103 in the direction of the optical axis 10, the shape of the electric field around the specimen 104 is kept constant, so that the distortion aberration can be reduced. Since the constant electric field applying electrode 151 is arranged between the upper magnetic path 114 and the deflector 140, similar to the first embodiment, the interference with the deflector 140 caused by the fluctuation in the electric field of the electrostatic lens can be prevented.

It should be noted that the invention is not limited to the above described first to fourth embodiments, and includes various modifications. The embodiments described above have been described in detail for easy understanding of the invention, and the invention is not necessarily limited to those including all the configurations described above. A part of the configuration of one embodiment can be replaced with the configuration of another embodiment, and the configuration of another embodiment can be added to the configuration of one embodiment. Apart of the configuration of each embodiment may be added, deleted, or replaced with another configuration.

What is claimed is:

1. A charged particle beam apparatus comprising:
a deflector that deflects a charged particle beam with which a specimen is irradiated;
an objective lens that focuses the charged particle beam on the specimen;
an electrostatic lens that includes a part of the objective lens and to which a voltage for correcting an aberration or a defocus of the charged particle beam is applied; and
an constant electric field applying electrode that is provided between the deflector and the electrostatic lens and to which a constant voltage having a same sign with the voltage applied to the electrostatic lens is applied.

2. The charged particle beam apparatus according to claim 1, wherein
the constant electric field applying electrode is arranged along a shape of the electrostatic lens.

3. The charged particle beam apparatus according to claim 1, wherein
the constant electric field applying electrode is divided in an irradiation direction of the charged particle beam, and a voltage is independently applied to each divided electrode.

4. The charged particle beam apparatus according to claim 3, wherein
each divided electrode has a same inner diameter, and a high voltage is applied as approaching the specimen.

5. The charged particle beam apparatus according to claim 1, wherein
the constant electric field applying electrode is divided in a circumferential direction which takes an irradiation direction of the charged particle beam as an axis, and a voltage is independently applied to each divided electrode.

6. The charged particle beam apparatus according to claim 1 further comprising:
a distance changing unit that changes a distance between the specimen and the objective lens; and
a specimen side electrode provided between the specimen and the objective lens.

7. The charged particle beam apparatus according to claim 6, wherein
a voltage applied to the specimen side electrode is adjusted according to the distance.

* * * * *